United States Patent
Guo et al.

(10) Patent No.: US 8,610,172 B2
(45) Date of Patent: Dec. 17, 2013

(54) FETS WITH HYBRID CHANNEL MATERIALS

(75) Inventors: Dechao Guo, Fishkill, NY (US);
Shu-Jen Han, Cortlandt Manor, NY (US); Edward William Kiewra, Verbank, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/326,825

(22) Filed: Dec. 15, 2011

(65) Prior Publication Data

US 2013/0153964 A1 Jun. 20, 2013

(51) Int. Cl.
*H01L 29/66* (2006.01)

(52) U.S. Cl.
USPC ...... 257/192; 257/24; 257/E29.249; 257/E21.403; 438/151; 438/218; 438/172; 438/591

(58) Field of Classification Search
CPC .......................................................... H01L 29/66
USPC ............ 257/24, 194, 192, E29.249, E21.403; 438/151, 218, 224, 591, 285, 172
See application file for complete search history.

(56) References Cited

U.S. PATENT DOCUMENTS

| | | | |
|---|---|---|---|
| 5,036,374 A | 7/1991 | Shimbo | |
| 6,429,061 B1 * | 8/2002 | Rim | 438/198 |
| 6,881,635 B1 * | 4/2005 | Chidambarrao et al. | 438/300 |
| 6,972,478 B1 * | 12/2005 | Waite et al. | 257/627 |
| 7,145,167 B1 | 12/2006 | Chu | |
| 7,232,765 B1 * | 6/2007 | Avanzino et al. | 438/705 |
| 7,244,958 B2 | 7/2007 | Shang et al. | |
| 7,247,534 B2 * | 7/2007 | Chidambarrao et al. | 438/223 |
| 7,282,425 B2 | 10/2007 | Koester et al. | |
| 7,741,167 B2 * | 6/2010 | Beyer et al. | 438/199 |
| 7,754,513 B2 * | 7/2010 | Mandelman et al. | 438/44 |
| 7,803,670 B2 * | 9/2010 | White et al. | 438/151 |
| 8,039,335 B2 * | 10/2011 | Beyer et al. | 438/199 |
| 8,125,032 B2 * | 2/2012 | Adetutu et al. | 257/347 |
| 8,232,153 B2 * | 7/2012 | Chidambarrao et al. | 438/199 |
| 8,263,468 B2 * | 9/2012 | Adam et al. | 438/300 |

(Continued)

OTHER PUBLICATIONS

Heyns et al., "Ge and III/V devices for advanced CMOS," ULIS, Mar. 18-20, 2009, pp. 83-86 (2009).

(Continued)

*Primary Examiner* — N Drew Richards
*Assistant Examiner* — Ankush Singal
(74) *Attorney, Agent, or Firm* — Vazken Alexanian; Michael J. Chang, LLC

(57) ABSTRACT

Techniques for employing different channel materials within the same CMOS circuit are provided. In one aspect, a method of fabricating a CMOS circuit includes the following steps. A wafer is provided having a first semiconductor layer on an insulator. STI is used to divide the first semiconductor layer into a first active region and a second active region. The first semiconductor layer is recessed in the first active region. A second semiconductor layer is epitaxially grown on the first semiconductor layer, wherein the second semiconductor layer comprises a material having at least one group III element and at least one group V element. An n-FET is formed in the first active region using the second semiconductor layer as a channel material for the n-FET. A p-FET is formed in the second active region using the first semiconductor layer as a channel material for the p-FET.

21 Claims, 3 Drawing Sheets

(56) References Cited

U.S. PATENT DOCUMENTS

| | | | |
|---|---|---|---|
| 2003/0162348 A1* | 8/2003 | Yeo et al. | 438/218 |
| 2004/0043558 A1* | 3/2004 | Wieczorek et al. | 438/241 |
| 2004/0132267 A1* | 7/2004 | Sadana et al. | 438/510 |
| 2004/0135138 A1* | 7/2004 | Hsu et al. | 257/19 |
| 2005/0085022 A1* | 4/2005 | Chidambarrao et al. | 438/151 |
| 2005/0093104 A1* | 5/2005 | Ieong et al. | 257/627 |
| 2006/0006389 A1* | 1/2006 | Buchholtz et al. | 257/70 |
| 2006/0237746 A1* | 10/2006 | Orlowski et al. | 257/192 |
| 2007/0196987 A1* | 8/2007 | Chidambarrao et al. | 438/285 |
| 2008/0001173 A1 | 1/2008 | Kiewra et al. | |
| 2008/0173901 A1 | 7/2008 | Zhu | |
| 2008/0179636 A1 | 7/2008 | Chidambarrao et al. | |
| 2008/0268587 A1* | 10/2008 | Sadaka et al. | 438/199 |
| 2009/0039389 A1 | 2/2009 | Tseng et al. | |
| 2009/0189242 A1* | 7/2009 | Costrini et al. | 257/506 |
| 2009/0212329 A1* | 8/2009 | Ieong et al. | 257/255 |
| 2009/0224369 A1* | 9/2009 | Gamble et al. | 257/616 |
| 2009/0243031 A1* | 10/2009 | Natzle et al. | 257/508 |
| 2009/0283756 A1 | 11/2009 | Hellings et al. | |
| 2009/0294801 A1 | 12/2009 | Harley et al. | |
| 2009/0309148 A1* | 12/2009 | Haensch et al. | 257/314 |
| 2009/0321794 A1* | 12/2009 | Kim et al. | 257/255 |
| 2010/0041221 A1* | 2/2010 | Arnold et al. | 438/585 |
| 2010/0065824 A1* | 3/2010 | Wang et al. | 257/24 |
| 2010/0109044 A1* | 5/2010 | Tekleab et al. | 257/190 |
| 2010/0159684 A1* | 6/2010 | Chang et al. | 438/585 |
| 2010/0213553 A1* | 8/2010 | Hargrove et al. | 257/410 |
| 2010/0230751 A1* | 9/2010 | Botula et al. | 257/347 |
| 2010/0304548 A1* | 12/2010 | Turner et al. | 438/435 |
| 2010/0308405 A1* | 12/2010 | Cai et al. | 257/347 |
| 2011/0001167 A1* | 1/2011 | Bedell et al. | 257/200 |
| 2011/0027950 A1* | 2/2011 | Jones et al. | 438/155 |
| 2011/0027952 A1* | 2/2011 | Kronholz et al. | 438/231 |
| 2011/0049627 A1* | 3/2011 | Chang et al. | 257/347 |
| 2011/0062492 A1* | 3/2011 | Ko et al. | 257/190 |
| 2011/0104878 A1* | 5/2011 | Beyer et al. | 438/478 |
| 2011/0129970 A1* | 6/2011 | Kronholz et al. | 438/197 |
| 2011/0156857 A1* | 6/2011 | Kurz et al. | 337/414 |
| 2012/0043612 A1* | 2/2012 | Baldwin | 257/368 |
| 2012/0052681 A1* | 3/2012 | Marsh | 438/680 |
| 2012/0074490 A1* | 3/2012 | Saitoh | 257/332 |
| 2012/0139044 A1* | 6/2012 | Zhu et al. | 257/347 |
| 2012/0217561 A1* | 8/2012 | Khakifirooz et al. | 257/314 |
| 2012/0267758 A1* | 10/2012 | Shroff et al. | 257/532 |
| 2012/0282760 A1* | 11/2012 | Kronholz et al. | 438/478 |
| 2012/0295420 A1* | 11/2012 | Pal et al. | 438/478 |
| 2012/0299062 A1* | 11/2012 | Chang et al. | 257/192 |

OTHER PUBLICATIONS

Takagi et al., "III-V/Ge CMOS technologies on Si platform," 2010 Symposium on VLSI Technology Digest (VLSIT), Jun. 15-17, 2010 of Technical Papers, pp. 147-148 (2010).

Caymax et al., "Germanium for advanced CMOS anno 2009: a SWOT analysis," IEDM 09, 19.3.1-19.3.4 (2009).

* cited by examiner

FETS WITH HYBRID CHANNEL MATERIALS

FIELD OF THE INVENTION

The present invention relates to complementary metal oxide semiconductor (CMOS) circuits and more particularly, to techniques for employing different channel materials within the same CMOS circuit.

BACKGROUND OF THE INVENTION

Due to their favorable electron transport properties, the use of III-V materials (i.e., materials that include at least one group III element and at least one group V element) has been proposed for future generations of complementary metal oxide semiconductor (CMOS) circuits. However, there are a few challenges associated with the use of III-V materials in field effect transistors (FETs). For example, a p-channel FET with a III-V material does not have good interface quality and does not have good hole mobility. These drawbacks have thus far been a barrier for widespread application of III-V materials in CMOS circuits.

Therefore, techniques that permit the integration of III-V materials in CMOS circuits without the above-described drawbacks would be desirable.

SUMMARY OF THE INVENTION

The present invention provides techniques for employing different channel materials within the same complementary metal oxide semiconductor (CMOS) circuit. In one aspect of the invention, a method of fabricating a CMOS circuit is provided. The method includes the following steps. A wafer is provided having a first semiconductor layer on an insulator. Shallow trench isolation is used to divide the first semiconductor layer into at least two portions, one of which serves as a first active region of the circuit and another of which serves as a second active region of the circuit. The first semiconductor layer is recessed in the first active region. A second semiconductor layer is epitaxially grown on the first semiconductor layer that has been recessed in the first active region, wherein the second semiconductor layer comprises a material having at least one group III element and at least one group V element. An n-channel field effect transistor (n-FET) is formed in the first active region using the second semiconductor layer as a channel material for the n-FET. A p-channel field effect transistor (p-FET) is formed in the second active region using the first semiconductor layer as a channel material for the p-FET.

In another aspect of the invention, a CMOS circuit is provided. The CMOS circuit includes a wafer having a first semiconductor layer on an insulator, wherein the first semiconductor layer is divided into at least two portions, one of which serves as a first active region of the circuit and another of which serves as a second active region of the circuit, and wherein the first semiconductor layer is recessed in the first active region as compared with the second active region; a second semiconductor layer on the first semiconductor layer in the first active region, the second semiconductor layer comprising an epitaxial material having at least one group III element and at least one group V element; an n-FET formed in the first active region, wherein the second semiconductor layer serves as a channel of the n-FET; and a p-FET formed in the second active region, wherein the first semiconductor layer serves as a channel of the p-FET.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for integrating different channel materials within a single complementary metal oxide semiconductor (CMOS) circuit. With such a hybrid design, channel materials such as group III-V materials can be employed, for example, as the n-channel field effect transistor (nFET) channel material, thus taking advantage of the beneficial properties (e.g., electron transport properties) of these materials. However, with the present configuration, a different channel material, such as germanium (Ge) can be used for the p-channel FETs (pFET) in the circuit, thus at the same time avoiding the above-described interface quality and hole mobility problems associated with group III-V materials and pFETs. In this manner, both FETs can experience the benefits of high channel carrier mobility. FIGS. 1-8 are diagrams illustrating an exemplary methodology for fabricating a CMOS circuit employing a hybrid channel material design.

Figure 1:
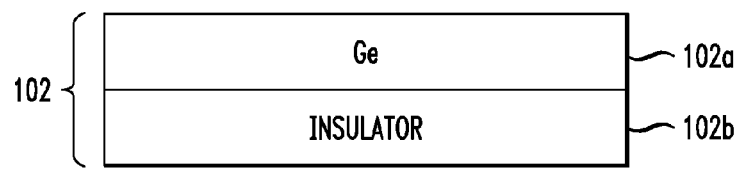
FIG. 1 is a cross-sectional diagram illustrating a starting structure for fabricating a complementary metal oxide semiconductor (CMOS) circuit, namely a wafer having a first semiconductor layer on an insulator according to an embodiment of the present invention.

FIG. 1 is a cross-sectional diagram illustrating a starting structure for the fabrication process, namely a wafer 102 having a semiconductor layer 102a on an insulator 102b (i.e., wafer 102 is a semiconductor-on-insulator (SOI) wafer). In general, a semiconductor-on-insulator wafer includes a layer of a semiconductor material separated from a substrate by a buried oxide or BOX. For ease of depiction, the substrate is not shown in the present figures.

According to an exemplary embodiment, semiconductor layer 102a is formed from germanium (Ge), i.e., wafer 102 is a germanium-on-insulator wafer, and insulator 102b, e.g., the BOX, is an oxide such as germanium oxide. Ge provides favorable mobility characteristics, as compared for example to silicon (Si), however semiconductor materials other than Ge, such as Si or silicon germanium (SiGe), could instead be used if so desired.

According to an exemplary embodiment, the semiconductor layer 102a has a thickness of from about 20 nanometers (nm) to about 50 nm. Several different semiconductor-on-insulator wafer configurations (such as germanium-on-insulator wafers) are commercially available. In this case, it may be necessary to thin the semiconductor layer in order to achieve the desired thickness for semiconductor layer 102a. By way of example only, an etching process, such as chemical mechanical polishing (CMP) or oxidation followed by an oxide strip, as is known in the art, may be employed to attain the desired thickness of the semiconductor layer.

Figure 2:
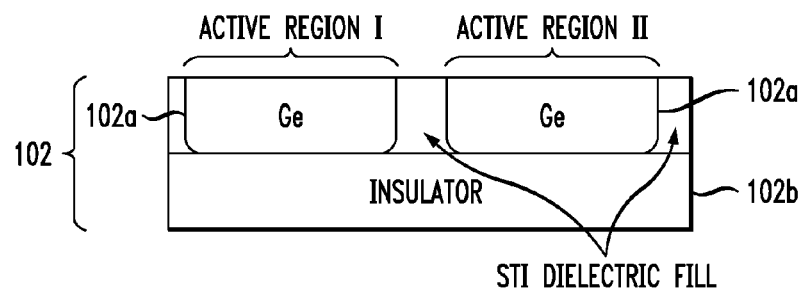
FIG. 2 is a cross-sectional diagram illustrating two active regions (Active region I and Active region II) having been formed in the wafer according to an embodiment of the present invention.
Figure 3:
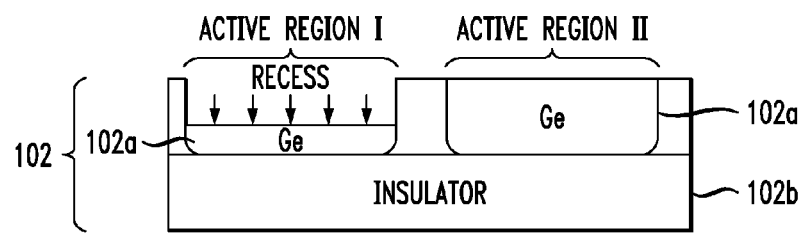
FIG. 3 is a cross-sectional diagram illustrating the first semiconductor layer having been recessed in Active region I according to an embodiment of the present invention.

Next, as shown in FIG. 2, at least two active regions are formed in the semiconductor layer 102a using standard shallow-trench isolation (STI) techniques to divide the semiconductor layer 102a into at least two portions. A first one of the portions, i.e., a "first portion," corresponds to a first one of the active regions, i.e., a "first active region" and a second one of the portions, i.e., a "second portion," corresponds to a second one of the active regions, i.e., a "second active region."

In general, STI processes involve etching one or more trenches through the semiconductor material layer (i.e., through semiconductor layer 102a) using for example a reactive ion etching (RIE) process such that the trenches reach the insulator (i.e., insulator 102b). The trenches are then filled with a dielectric material, such as an oxide. Any excess dielectric material can be removed using a wet etch technique. In this case, the dielectric material (labeled "STI dielectric fill") isolates the first active region from the second active region in the wafer.

In the example shown in FIG. 2, two active regions (labeled "Active region I" and "Active region II") have been defined. However, this particular configuration is being shown for illustrative purposes only and it is to be understood that according to the present techniques more active regions may be formed than are shown, the number of which can vary depending on the particular requirements of the circuit being fabricated.

According to an exemplary embodiment, an n-FET will be formed in one of the active regions and a p-FET will be formed in the other active region. Arbitrarily, in the figures and the following description, the n-FET will be formed in Active region I and the p-FET will be formed in Active region II. This is however just an arbitrary designation and either FET could be formed in either region.

In general, a FET includes a source region and a drain region interconnected by a channel(s). A gate over the channel regulates electron flow through the channel. The gate is typically separated from the channel by a gate dielectric. Suitable gate/gate dielectric materials will be described in detail below.

The semiconductor layer 102a is then recessed in Active region I. See FIG. 3. As highlighted above, an n-FET will be formed in Active region I. According to an exemplary embodiment, semiconductor layer 102a in Active region I is recessed using an etching process, such as chemical mechanical polishing. The etch can be endpointed based on the desired ending thickness of the recessed semiconductor layer 102a.

For instance, a hardmask (not shown) as known in the art may be deposited over the semiconductor layer 102a in both active regions. Suitable hardmask materials include, but are not limited to, an oxide or nitride (e.g., silicon nitride) material, having a thickness of, e.g., from about 5 nm to about 10 nm. Standard lithography techniques (for example, using a patterned photoresist layer as known in the art) are then used to pattern the hardmask such that the hardmask, post-patterning, remains only over Active region II. This patterning process to pattern the hardmask can involve standard wet etch or reactive ion etching (RIE) processes. The semiconductor layer 102a in Active region I may then be recessed in Active region I, as described above. The hardmask covering Active region II is preferably removed after the epitaxial growth of the Epi III-V material is performed in Active region I over the recessed semiconductor layer 102a, see FIG. 4. That way the epitaxial growth will be limited to the exposed Active region I. As described above, the hardmask can be removed using standard wet etch or reactive ion etching (RIE) processes.

According to another exemplary embodiment, a series of oxidation/oxide strip steps, as is known in the art, can be used to incrementally reduce the thickness of the semiconductor layer 102a in Active region I. By way of example only, the resulting thickness of semiconductor layer 102a in Active region I after the recess is performed is from about 5 nm to about 15 nm, e.g., from about 10 nm to about 15 nm. Prior to this oxidation process, a hardmask (not shown) may be formed in the same manner described immediately above in order to mask/protect the semiconductor layer 102a in Active region II and to limit the subsequent epitaxial growth (see FIG. 4) to exposed Active region I.

Figure 4:
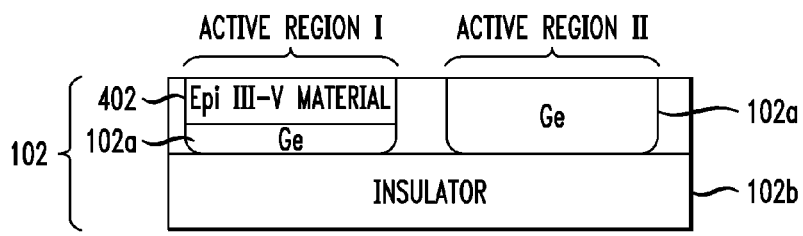
FIG. 4 is a cross-sectional diagram illustrating a second semiconductor layer containing a III-V material having been epitaxially grown in Active region I over the recessed first semiconductor layer, wherein the second semiconductor layer will serve as a channel material in Active region I and the first semiconductor layer will serve as a channel material in Active region II according to an embodiment of the present invention.

As shown in FIG. 4, epitaxial growth of a semiconductor layer 402 (labeled "Epi III-V material") that is composed of a different semiconductor material (from semiconductor layer 102a) is performed in Active region I over the recessed semiconductor layer 102a in that region. According to an exemplary embodiment, semiconductor layer 402 is composed of a III-V material.

The term III-V material, as used herein, refers to a material that includes at least one group III element and at least one group V element. By way of example only, suitable III-V materials include, but are not limited to, aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum phosphide, boron arsenide, boron nitride, boron phosphide, gallium antimonide, gallium arsenide, gallium arsenide phosphide, gallium indium arsenide antimonide phosphide, gallium nitride, gallium phosphide, indium antimonide, indium arsenide, indium arsenide antimonide phosphide, indium gallium arsenide, indium gallium nitride, indium gallium phosphide, indium nitride, indium phosphide and/or combinations including at least one of the foregoing materials.

According to an exemplary embodiment, the III-V material is epitaxially grown in Active region I using a molecular-beam approach to form semiconductor layer 402. Molecular-beam epitaxy (MBE) is a process well known to those of skill in the art. In general, molecular beam epitaxy is conducted under a vacuum (e.g., in a vacuum chamber) where component elements contained in separate effusion cells are heated until the elements sublimate. The resulting gaseous elements then condense on the target substrate. In this case, the component elements are III-V materials.

With this approach, thin films of the above-referenced III-V materials can be formed in Active region I, wherein growth is limited to the recessed semiconductor layer 102a (see above). The III-V material(s) deposited in Active region I may be deposited as a single layer or as multiple layers, each layer containing a III-V material. Thus, the semiconductor layer 402 may be made up of a single layer of a III-V material or alternatively, multiple layers (in a stacked configuration) each layer containing a III-V material.

Excess epitaxial III-V material grown in Active region I can then be removed using an etching process. Suitable etching processes include, but are not limited to chemical-mechanical polishing (CMP). A process such as CMP is advantageous since it provides a flat, planar surface on which the various other components of the device can be subsequently built (as described below).

The result is a wafer having two different channel materials in Active region I and in active region II, i.e., semiconductor layer 402 composed of a III-V material versus semiconductor layer 102a composed of Ge, on which a n-FET and a p-FET can now be fabricated, respectively. The term "hybrid" as used herein refers to this use of multiple, different channel materials within the same CMOS circuit, i.e., one channel material in Active region I and another channel material in Active region II. Now that a wafer has been fabricated having hybrid channel materials, the remainder of the process outlined below is merely exemplary and can be varied accordingly by one of skill in the art, given the present teachings, for a variety of different applications.

Figure 5:
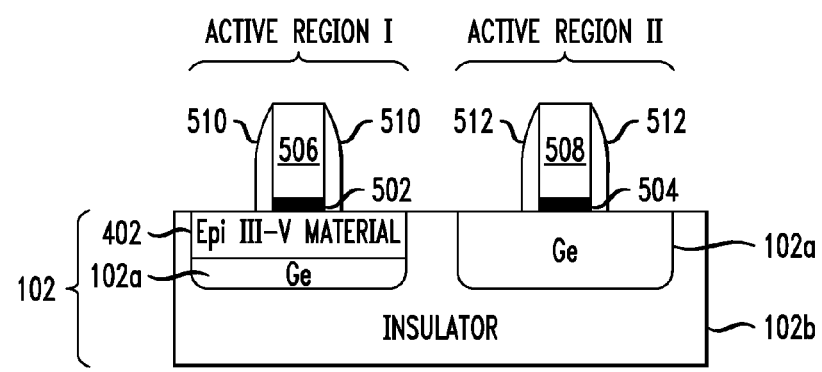
FIG. 5 is a cross-sectional diagram illustrating gate dielectrics having been formed over the first and second semiconductor layers, gates having been formed on the gate dielectrics and spacers having been formed on opposite sides of the gates according to an embodiment of the present invention.
Figure 6:
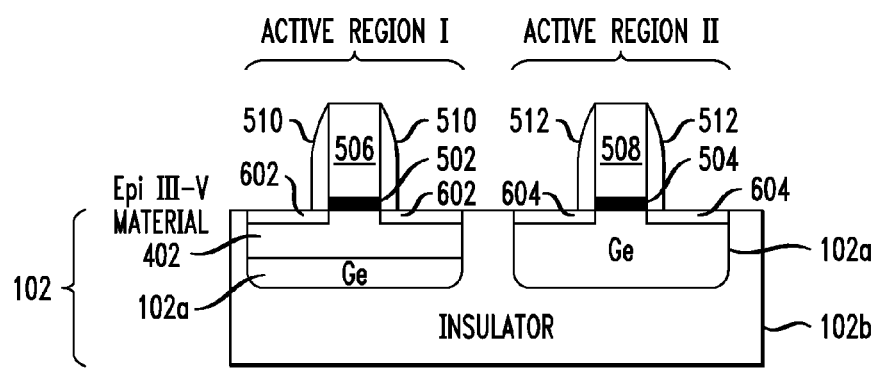
FIG. 6 is a cross-sectional diagram illustrating source/drain extension regions having been formed in each of Active region I and Active region II according to an embodiment of the present invention.
Figure 7:
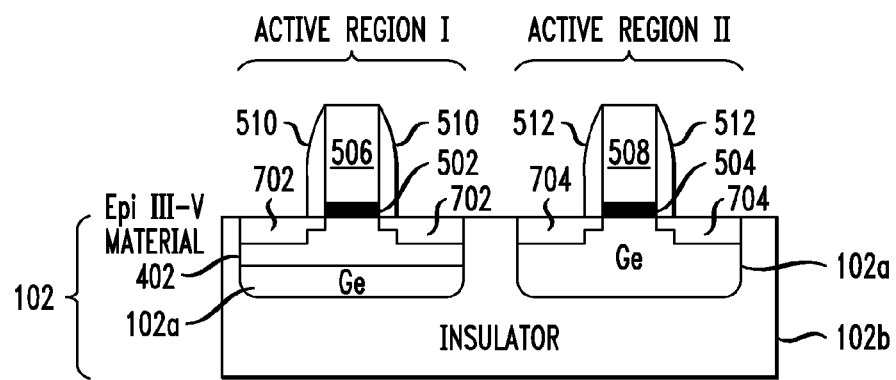
FIG. 7 is a cross-sectional diagram illustrating the source/drain extension regions having been expanded to form source and drain regions according to an embodiment of the present invention.
Figure 8:
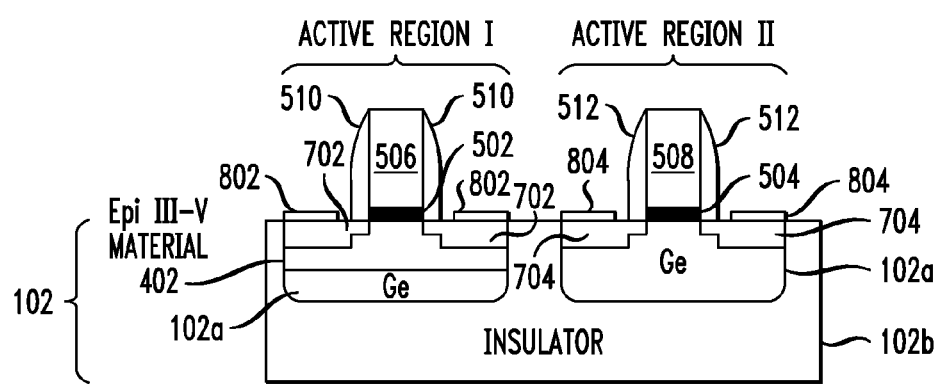
FIG. 8 is a cross-sectional diagram illustrating conductive contacts having been formed to the source and drain regions according to an embodiment of the present invention.

As shown in FIG. 5, a gate dielectric layer is then formed on the respective channel material (semiconductor layer 402 (III-V material) and semiconductor layer 102a (Ge), respectively) in Active region I and Active region II. The characteristics (i.e., composition, thickness, etc.) of the gate dielectric can be varied for each region depending, for example, on the type of gate that will be employed. Alternatively, the same gate dielectric can be employed in both regions.

By way of example only, if a metal gate is formed (see below) a high-k gate dielectric may be employed. If, however, a doped poly-silicon (poly-Si) gate is being used (see below) an oxide gate dielectric may be employed. Further, according to the present techniques, different gate materials may be employed in the same circuit. For example, the gate formed in the Active region I may be a metal gate while the gate formed in Active region II may be a doped poly-Si gate, or vice versa. Optionally, the same type of gate, i.e., metal or poly-Si, may be formed in both regions.

Thus, in this step, a suitable gate dielectric material is deposited on the channel material in both Active region I and Active region II to form gate dielectrics 502 and 504. As highlighted above, suitable gate materials include, but are not limited to, a high-k gate dielectric material (such as hafnium oxide ($HfO_2$)) for a metal gate and an oxide (such as silicon dioxide ($SiO_2$)) for a doped poly-Si gate. In the simplest case where the same gate dielectric is used in both regions, the gate dielectric material can be blanket deposited over the wafer and then patterned to remove gate dielectric material from all but those areas over the channel material where it is desired. Similarly, when a different gate dielectric material is employed in each of the active regions, a first gate dielectric material can be blanket deposited over the wafer and then patterned to remove that first gate dielectric material from all but those areas over the channel material in the active region in which it is desired. Next, a second gate dielectric material can be blanket deposited over the wafer (and the first gate dielectric material) and then patterned to remove that second gate dielectric material from all but those areas over the channel material in the other active region in which it is desired.

A suitable gate material is then deposited over the gate dielectric and patterned to form gates 506 and 508 on gate dielectrics 502 and 504 over the epitaxial III-V material (Active region I) and Ge (Active region II), respectively. Semiconductor layer 402 (III-V material) and semiconductor layer 102a (Ge) will serve as the channel regions of the FETs. As highlighted above, suitable gate materials include, but are not limited to a metal (such as aluminum, nickel, platinum) or doped poly-Si. In the simplest case where the same gate material is used in both regions, the given gate material can be blanket deposited over the wafer and then patterned to remove gate material from all but those areas over the gate dielectric where it is desired.

When a different gate material is employed in each of the active regions, a first gate material (e.g., metal or poly-Si) can be blanket deposited over the wafer and then patterned to remove that first gate material from all but those areas over the gate dielectric in the active region in which it is desired. Next, a second gate material can be blanket deposited over the wafer (and the first gate material) and then patterned to remove that second gate material from all but those areas over the gate dielectric in the other active region in which it is desired.

Spacers are formed on opposite sides of each of gate 506 and 508. See FIG. 5, wherein spacers 510 have been formed on opposite sides of gate 506 and spacers 512 have been formed on opposite sides of gate 508. According to an exemplary embodiment, spacers 510 and 512 each are formed from a nitride material, such as silicon nitride (SiN). According to an exemplary embodiment, the spacer material (e.g., SiN) is blanket deposited on the wafer, and then patterned (e.g., using RIE) to form spacers 510 and 512.

Source/drain extension regions 602 and 604 are then formed in each of Active region I and Active region II, respectively. See FIG. 6. According to an exemplary embodiment, the source/drain extension regions 602 and 604 are formed by way of conventional source/drain extension implantation techniques using dopants such as phosphorous or arsenic for n-channel FETs and boron for p-channel FETs.

Conventional source/drain implantation techniques are then used to form source and drain regions 702 and 704. See FIG. 7. As provided above, phosphorous or arsenic are suitable dopants for n-channel FETs and boron is a suitable dopant for p-channel FETs.

Conductive contacts 802 and 804 are formed to the source and drain regions. See FIG. 8. According to an exemplary embodiment, the conductive contacts 802 and 804 are formed from a metal(s), such as nickel and/or platinum. Contacts 802 and 804 may be formed using a conventional lift-off process.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a complementary metal oxide semiconductor (CMOS) circuit, comprising the steps of:
   providing a wafer having a first semiconductor layer on an insulator, wherein the first semiconductor layer comprises germanium;
   using shallow trench isolation to divide the first semiconductor layer into at least two portions, one of which serves as a first active region of the circuit and another of which serves as a second active region of the circuit;
   forming a hardmask covering the second active region;
   recessing the first semiconductor layer in the first active region using a series of oxidation and oxide strip steps to incrementally reduce a thickness of the first semiconductor layer in the first active region;
epitaxially growing a second semiconductor layer on the first semiconductor layer that has been recessed in the first active region, wherein the second semiconductor layer comprises a material having at least one group III element and at least one group V element;
removing the hardmask after epitaxially growing the second semiconductor layer such that the hardmask serves to mask the second active region while both the step of recessing the first semiconductor layer and the step of epitaxially growing the second semiconductor layer are being performed;
forming an n-channel field effect transistor (n-FET) in the first active region using the second semiconductor layer as a channel material for the n-FET; and
forming a p-channel field effect transistor (p-FET) in the second active region using the first semiconductor layer as a channel material for the p-FET.

2. The method of claim 1, wherein the insulator comprises germanium oxide.

3. The method of claim 1, wherein the step of using shallow trench isolation to divide the first semiconductor layer into the at least two portions comprises the steps of:
etching one or more trenches through the first semiconductor layer; and
filling the trenches with a dielectric.

4. The method of claim 1, wherein the first semiconductor layer is recessed in the first active region to a thickness of from about 5 nm to about 15 nm.

5. The method of claim 1, wherein the second semiconductor layer comprises a material selected from the group consisting of aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum phosphide, boron arsenide, boron nitride, boron phosphide, gallium antimonide, gallium arsenide, gallium arsenide phosphide, gallium indium arsenide antimonide phosphide, gallium nitride, gallium phosphide, indium antimonide, indium arsenide, indium arsenide antimonide phosphide, indium gallium arsenide, indium gallium nitride, indium gallium phosphide, indium nitride, indium phosphide and combinations comprising at least one of the foregoing materials.

6. The method of claim 1, wherein the second semiconductor layer is epitaxially grown over the first semiconductor layer in the first active region using molecular beam epitaxy.

7. The method of claim 1, further comprising the step of:
planing the second semiconductor layer after the second semiconductor layer is epitaxially grown over the first semiconductor layer in the first active region.

8. The method of claim 1, wherein the step of forming the n-FET in the first active region comprises the steps of:
forming an n-FET gate dielectric on the second semiconductor layer;
forming an n-FET gate on the n-FET gate dielectric;
forming spacers on opposite sides of the n-FET gate; and
forming source and drain regions in the second semiconductor layer.

9. The method of claim 1, wherein the step of forming the p-FET in the second active region comprises the steps of:
forming a p-FET gate dielectric on the first semiconductor layer;
forming a p-FET gate on the p-FET gate dielectric;
forming spacers on opposite sides of the p-FET gate; and
forming source and drain regions in the first semiconductor layer.

10. The method of claim 1, wherein the second semiconductor layer is epitaxially grown as multiple layers in a stacked configuration wherein each of the layers comprises a material having at least one group III element and at least one group V element.

11. The method of claim 7, wherein the second semiconductor layer is planed using chemical-mechanical polishing.

12. The method of claim 8, wherein the n-FET gate comprises a metal gate or a doped poly-silicon gate.

13. The method of claim 9, wherein the p-FET gate comprises a metal gate or a doped poly-silicon gate.

14. A CMOS circuit, comprising:
a wafer having a first semiconductor layer on an insulator, wherein the first semiconductor layer comprises germanium and is divided into at least two portions, one of which serves as a first active region of the circuit and another of which serves as a second active region of the circuit, and wherein the first semiconductor layer is recessed in the first active region as compared with the second active region;
a second semiconductor layer on the first semiconductor layer in the first active region, the second semiconductor layer comprising an epitaxial material having at least one group III element and at least one group V element;
an n-FET formed in the first active region, wherein the second semiconductor layer serves as a channel of the n-FET; and
a p-FET formed in the second active region, wherein the first semiconductor layer serves as a channel of the p-FET.

15. The CMOS circuit of claim 14, wherein the second semiconductor layer comprises a material selected from the group consisting of aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum phosphide, boron arsenide, boron nitride, boron phosphide, gallium antimonide, gallium arsenide, gallium arsenide phosphide, gallium indium arsenide antimonide phosphide, gallium nitride, gallium phosphide, indium antimonide, indium arsenide, indium arsenide antimonide phosphide, indium gallium arsenide, indium gallium nitride, indium gallium phosphide, indium nitride, indium phosphide and combinations comprising at least one of the foregoing materials.

16. The CMOS circuit of claim 14, wherein the n-FET comprises:
an n-FET gate dielectric on the second semiconductor layer;
an n-FET gate on the n-FET gate dielectric;
spacers on opposite sides of the n-FET gate; and
source and drain regions formed in the second semiconductor layer.

17. The CMOS circuit of claim 14, wherein the p-FET comprises:
a p-FET gate dielectric on the first semiconductor layer;
a p-FET gate on the p-FET gate dielectric;
spacers on opposite sides of the p-FET gate; and
source and drain regions formed in the first semiconductor layer.

18. The CMOS circuit of claim 14, wherein the insulator comprises germanium oxide.

19. The CMOS circuit of claim 14, wherein the second semiconductor layer comprises multiple layers in a stacked configuration wherein each of the layers comprises an epitaxial material having at least one group III element and at least one group V element.

20. The CMOS circuit of claim 16, wherein the n-FET gate comprises a metal gate or a doped poly-silicon gate.

21. The CMOS circuit of claim 17, wherein the p-FET gate comprises a metal gate or a doped poly-silicon gate.

* * * * *